United States Patent [19]

Kingsford-Smith

[11] 3,928,813

[45] Dec. 23, 1975

[54] DEVICE FOR SYNTHESIZING FREQUENCIES WHICH ARE RATIONAL MULTIPLES OF A FUNDAMENTAL FREQUENCY

[75] Inventor: Charles A. Kingsford-Smith, Loveland, Colo.

[73] Assignee: Hewlett-Packard Company, Palo Alto, Calif.

[22] Filed: Sept. 26, 1974

[21] Appl. No.: 509,577

[52] U.S. Cl. .................................... 331/1 A; 331/25

[51] Int. Cl.$^2$ .............................................. H03B 3/04

[58] Field of Search .......................... 331/1 A, 18, 25

[56] References Cited

UNITED STATES PATENTS

| | | | |
|---|---|---|---|
| 3,185,938 | 5/1965 | Pelosi | 331/25 X |
| 3,516,007 | 6/1970 | Bos et al. | 331/18 |
| 3,872,397 | 3/1975 | Hanneman | 331/1 A |

*Primary Examiner*—Siegfried H. Grimm
*Attorney, Agent, or Firm*—Ronald E. Grubman

[57] ABSTRACT

A frequency synthesizer is disclosed which can provide frequencies which are rational multiples of a fundamental reference frequency. The synthesizer includes a voltage-controlled oscillator in a phase-locked loop with the reference frequency. A modulo-N counter is included to allow synthesis of harmonics of the reference frequency. To obtain rational fractional frequencies between harmonics a "cycle swallower" is provided to occasionally abruptly shift the phase of the oscillator output. The swallowing rate is determined by the contents of a storage register which is pre-loaded with a representation of the desired frequency. The contents of this storage register are periodically loaded into and accumulated in an accumulator which generates an overflow signal to the cycle swallower whenever the accumulated value exceeds its maximum storage capacity. In response to the average rate of phase shifting by the swallower, the loop stabilizes when the oscillator frequency is equal to the desired rational multiple of the reference frequency.

4 Claims, 4 Drawing Figures

DEVICE FOR SYNTHESIZING FREQUENCIES WHICH ARE RATIONAL MULTIPLES OF A FUNDAMENTAL FREQUENCY

BACKGROUND OF THE INVENTION

The invention pertains generally to frequency synthesizers and more particularly to a device for generating frequencies which may be any arbitrary rational multiple of a fundamental reference frequency.

It is known in the art to snythesize frequencies by means of a phase-locked loop circuit. Typically the loop includes a voltage-controlled tunable oscillator (VCO) whose output is locked to a known reference frequency by means of a phase comparator. When the two frequencies differ, the phase comparator generates an output voltage which is fed back to the VCO to pull the VCO frequency to the reference frequency. By interposing a divide-by-N ( $\div N$) block or modulo-N counter in the circuit, the reference frequency may instead be phase compared with the oscillator frequency divided by N; the loop will then stabilize when the oscillator frequency is equal to N times the reference frequency. By varying the integer N, it is possible to generate frequencies which are the Nth harmonics of the reference frequency.

It is often desirable however to have the capability of generating frequencies which are not precisely equal to any harmonic of the reference frequency, but which may be any rational frequency between harmonics. In the prior art the generation of arbitrary frequencies has typically involved complicated circuits which perform repeated frequency division and addition to generate the desired frequencies. Such techniques have been employed to generate different frequencies directly from a reference oscillator, and have also been used in conjunction with phase-locked loop synthesizers. However, to achieve high frequency resolution with these techniques requires undue circuit complexity with concomitant cost disadvantages.

SUMMARY OF THE INVENTION

In accordance with the illustrated preferred embodiments the present invention provides an electronic frequency synthesizer which generates frequencies at arbitrary rational multiples of a fundamental reference frequency. The synthesizer uses a phase-locked loop including a VCO and an internal frequency divider to establish basic harmonic frequencies of the fundamental. In order to generate frequencies at rational intervals between harmonics a "cycle swallower" is utilized which periodically removes one cycle from the signal output of the VCO. The operative effect is equivalent to introducing a sudden negative phase shift of 360° in the VCO signal which is phase compared to the reference frequency. In response to the phase shift the phase comparator generates an error signal which increases the output frequency of the VCO. Depending on the rate of cycle swallowing, the VCO frequency can be stabilized at desired frequencies which are rational multiples of the fundamental frequencies.

In accordance with the preferred embodiments of the invention the rate of cycle swallowing is determined by an integer which is pre-set into simple digital register whose contents are periodically transferred into a digital accumulator. Whenever the accumulator is full, it generates a carry signal which triggers the cycle swallower. The rate of cycle swallowing and hence the stable output frequency of the phase-locked loop may therefore be arbitrarily selected.

DESCRIPTION OF THE INVENTION

The invention may be best understood by first referring to the more usual phase-locked loop aspects of the present synthesizer. These are described in the following paragraph. Subsequently the novel aspects and operation of the present invention are presented.

Figure 1:
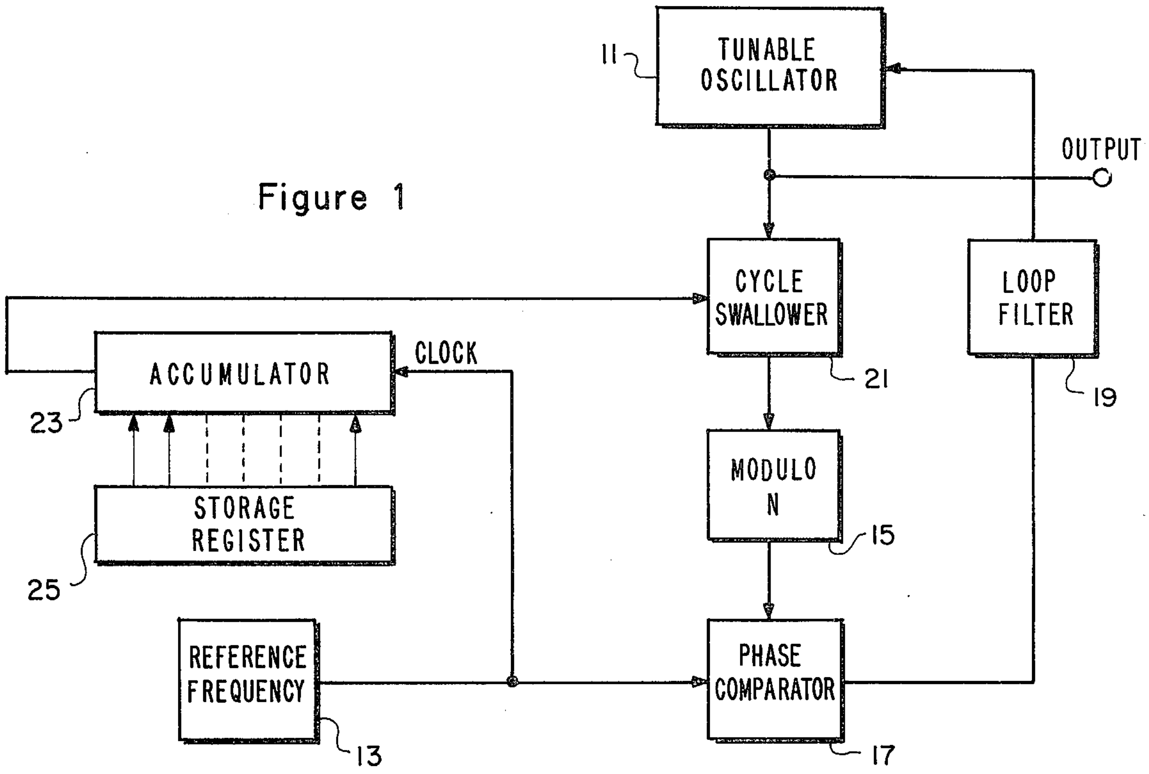
FIG. 1 is a block diagram representation of a phase-locked loop frequency synthesizer according to the invention.

In FIG. 1 there is shown a tunable oscillator 11. The oscillator may be, e.g., a voltage-controlled oscillator (VCO) whose frequency can be controlled by means of varying voltage input. A reference source 13 is illustrated whose output is a stable signal at a known output frequency, which will hereafter be referred to as $f_{ref}$. The output of VCO 11 is directed to an electronic $\div N$ network or a modulo-N counter 15. These networks are known in the art and in the case of a $\div N$ network provide an output frequency which is $1/N$ times the frequency inputted to the network. In the preferred embodiment of the present invention a modulo-N counter 15 may be implemented by means of standard digital electronics. A phase comparator 17 compares the phase of the reference signal $f_{ref}$ with the phase of the divided frequency signal from oscillator 11 and modulo-N counter 15. Of the numerous phase comparison devices available and known in the art, a preferable comparator is a set-reset flip-flop, sometimes referred to as a bistable multivibrator. In response to a phase difference between the two signals inputted to comparator 17, the comparator generates a voltage output signal. The voltage error signal from comparator 17 is fed back to oscillator 11 to control the oscillator frequency. In some preferred embodiments of the invention a low pass filter 19 is interposed between the phase comparator and the VCO to block any sum frequencies resulting from the heterodyning effect of comparator 17 and to govern the dynamic performance of the phase-locked loop. Amplification or other signal processing circuitry may be included to suitably shape the signal input to oscillator 11.

The description thus far describes a frequency synthesizer whose output frequency will be $N \times f_{ref}$. If the modulo-N counter 15 includes provision for selecting among a set of integers as is known in the art, then the frequency synthesizer as described above may produce a set of frequencies which are harmonics of $f_{ref}$.

In order to lock the phase loop at frequencies other than harmonics of the reference frequency a "cycle swallower" 21 is interposed in the circuit between oscillator 11 and modulo-N counter 15. Particular embodiments of cycle swallower 21 will be described below, but for purposes of understanding the invention, it need only be known that in operation cycle swallower 21 occasionally diverts an output pulse from oscillator 11 so that modulo-N counter 15 will not see that pulse. This is equivalent to an abrupt phase shift of the oscillator signal by 360°. Such a phase shift may also be realized by a momentary change of the counter modulus from $N$ to $N+l$ or $N-l$. By suitably driving cycle swallower 21 the average rate of phase shift introduced may be made proportional to a predetermined frequency, the lagging of the signal thus introduced causes the Nth count from the oscillator to be delayed by a time corresponding to one cycle of the oscillator.

In this case, the spacing of the output pulses from modulo-N counter 15 will be equal to $N+l$ periods of the oscillator. For example, suppose that, in M reference periods, cycle swallower 21 is operated $K$ times, (where K<M). For the phase-locked loop to lock, the average spacing of the pulses coming out of modulo-N counter 15 must equal the reference period. That is, in M reference periods, the oscillator frequency must achieve a value such that $$(M \text{ reference periods}) = \begin{matrix}\text{Number of pulses} \\ \text{normally spaced}\end{matrix} \times \begin{matrix}\text{Normal pulse} \\ \text{spacing}\end{matrix} + \begin{matrix}\text{Number of pulses} \\ \text{with spacing altered} \\ \text{by cycle swallowing}\end{matrix} \times \begin{matrix}\text{Pulse} \\ \text{spacing after} \\ \text{swallowing}\end{matrix}$$

In terms of a frequency $f$ which will be achieved by the oscillator, this equation reads:

$$\frac{M}{f_{ref}} = (M-k)\ \frac{N}{f} + k\ \left(\frac{N+1}{f}\right)$$

from which it is apparent that the oscillator frequency is $$f = \frac{MN+k}{M/f_{ref}} = \left(N + \frac{k}{M}\right)\ f_{ref}\,.$$

Since $k$ and M are integers, and $k$<M, this may be written $$f = (\mathrm{N.F})\, f_{ref}\,,$$

where F = k/M, and may be termed the fractional deviation from the Nth harmonic of $f_{ref}$.

Although the foregoing describes an operation which removes one cycle, it is evident that the principles of the invention may be implemented by adding one cycle upon command, in which case the frequency locks to $(N\text{-}0.F) \times f_{ref}$. In other words, the cycle swallower of the invention includes the concept of a "cycle burper."

In accordance with the preferred embodiments the rate at which cycles are swallowed, and hence the ultimate synthesized frequency, is determined by a number which is preloaded into a digital register 25. The preloaded number represents the desired fractional deviation from a harmonic of the reference frequency. In response to a clock signal at the reference frequency, accumulator 23 is periodically loaded with the contents of program register 25. Thus the accumulator is incremented by the desired fractional value once each reference period. Whenever the contents of accumulator 23 exceed its maximum holding capacity the accumulator generates a carry signal which triggers cycle swallower 21. The rate of phase lag induced by the cycle swallower is therefor dependent on the present fractional value loaded into register 25.

For example, assume that $F$ is 0.1 (i.e., it is desired to lock the VCO to $N.1 \times f_{ref}$). Then in 10 cycles (or periods) of $f_{ref}$ the oscillator phase change will be $10N+1$ cycles. It can be seen then that since the accumulator contents increase by 0.1 once each reference, a carry will occur at the 10th period. (Here is assumed that the highest possible number which accumulator 23 can hold is 0.999 . . . .) In response to the carry signal cycle swallower 21 substracts 1 full cycle from the counter from the oscillator output and the accumulator begins reloading on the next fractional cycle. If $1/F$ is not an integer a residual number will be left in the accumulator when the carryover overflow occurs. However the overflow, and hence the cycle swallowing, occurs at a rate which keeps the total phase of the oscillator always within one cycle of the theoretical phase. A frequency counter will therefore always read N.F to whatever resolution is determined by its gate time.

Figure 2:
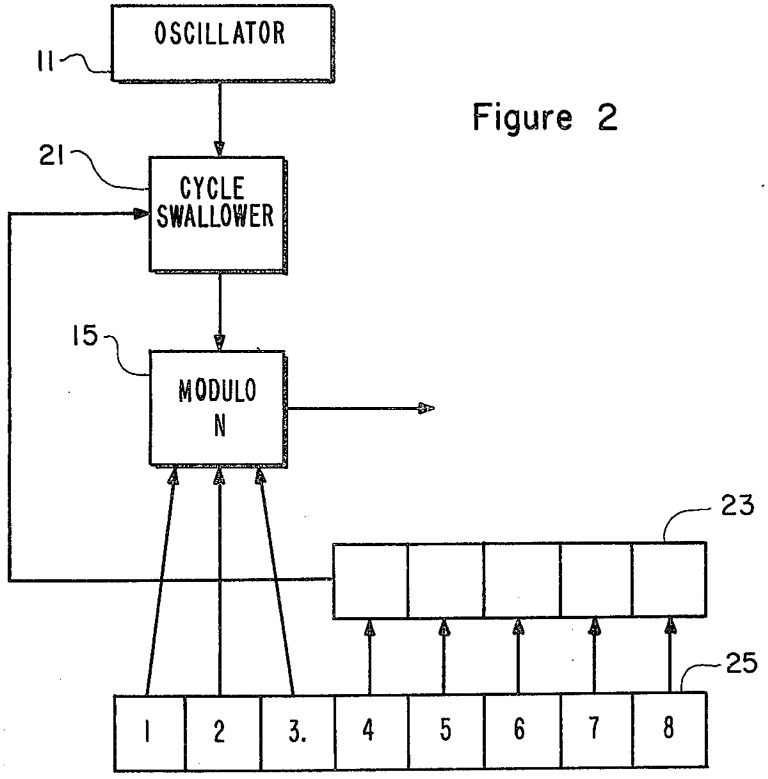
FIG. 2 illustrates a particular embodiment of several elements of the synthesizer.

In FIG. 2 there is illustrated an embodiment of the invention in which programmed register 25 is loaded with a value representing the desired multiple of the fundamental frequency including both the integer harmonic and a fractional portion thereof. In this embodiment the fractional portion is loaded into accumulator 23 while the integer portion here represented by the first three digits 1, 2, and 3 serves to select a particular integer N in modulo-N counter 15. As discussed above the output of accumulator 23 (i.e., carry pulses) drives cycle swallower 21. For the particular digits illustrated and a reference frequency of 100 Kilohertz, this phase-locked loop according to the invention will generate a stable frequency output of 123.45678 × 100 KHz or 12.345678 MHz.

Figure 3:
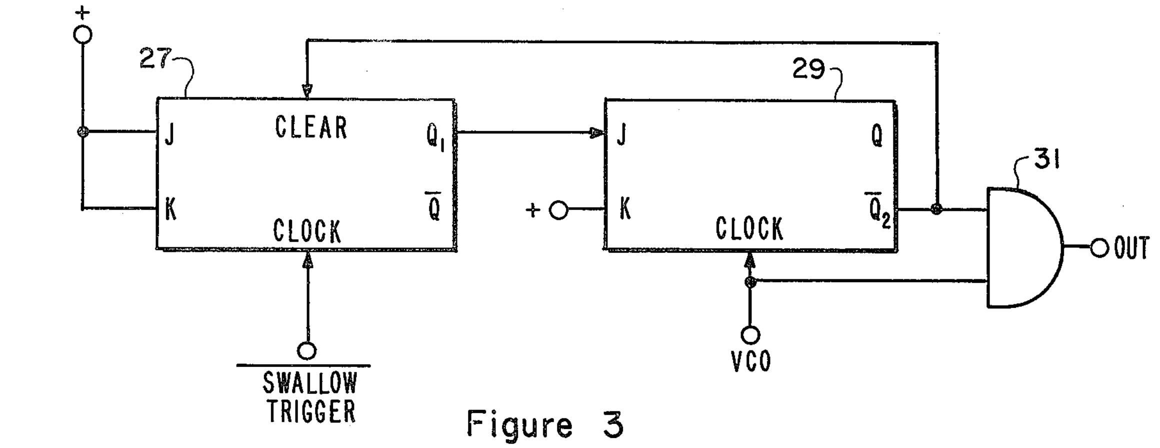
FIG. 3 shows an embodiment of a cycle swallower.

In FIG. 3 two negative edge-triggered J–K flip-flops are shown. The clock input to flip-flop 27 is labeled "swallow trigger" and is simply the negative of the carry pulse from accumulator 23 (of FIG. 1). Flip-flop 29 is clocked by the pulse stream output of VCO 11 (of FIG. 1). The VCO signal is gated with the $Q_2$ output of flip-flop 29 in an AND gate 31 whose output is the output signal of the cycle swallower.

Figure 4:
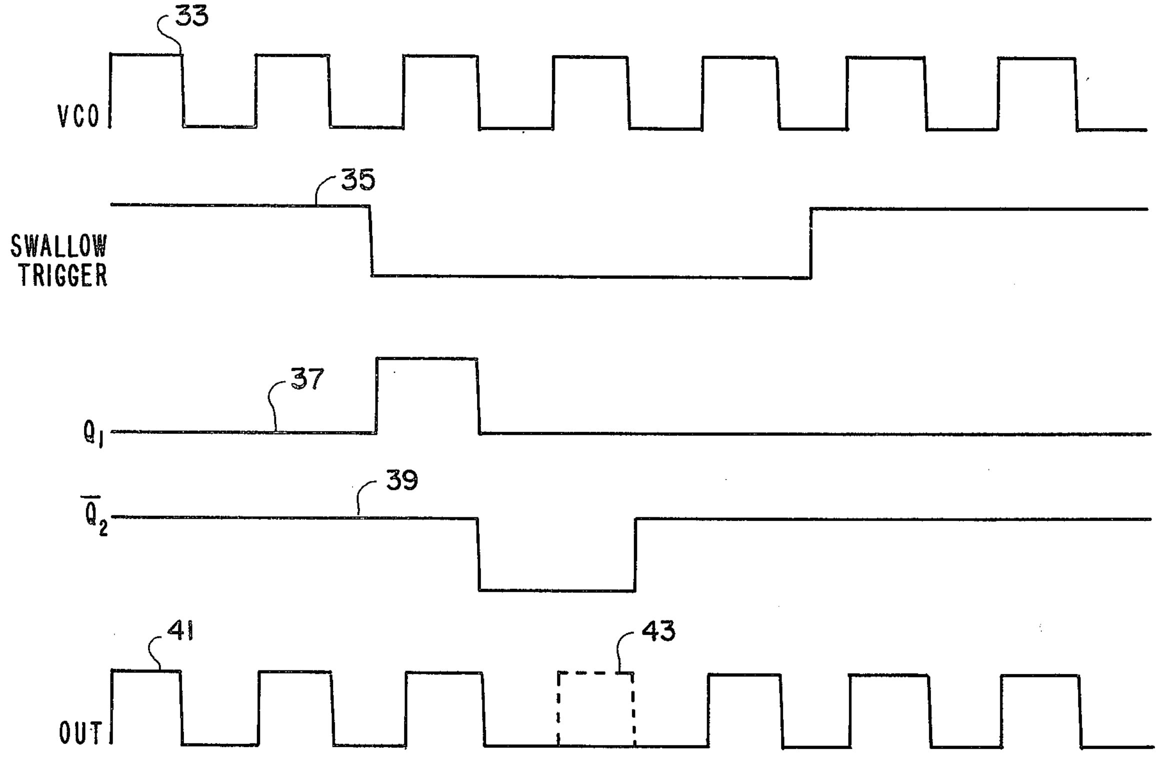
FIG. 4 illustrates various waveforms involved in cycle swallowing according to the embodiment of FIG. 3.

The pulse swallowing operation may be understood by reference to FIG. 4 which illustrates typical waveforms in and out of the cycle swallower. A chain of VCO pulses 33 serves as the clock for flip-flop 29. A swallow trigger signal 35 is illustrated generally as being asynchronous with the VCO pulses. However, flip-flop 27 will trigger on the negative edge of swallow trigger 35 and output a $Q_1$ pulse to flip-flop 29. When the next negative edge of VCO signal 33 appears at the clock of flip-flop 29, the $Q_2$ output goes negative. This output resets flip-flop 27 and also provides an "off" input to AND gate 31. Thus, the next VCO pulse 43 will not appear at the output of gate 31; it has been, so to say, swallowed. The negative edge of pulse 43 again triggers flip-flop 29 allowing the subsequent pulses of the VCO signal 33 to pass through gate 31. The swallower is thus ready to receive the next swallow command.

I claim:

1. An electronic frequency synthesizer of the phase-locked loop type for generating frequencies which are desired rational multiples of the frequency of a reference signal, said synthesizer comprising:

frequency generating means for producing an output signal of a frequency responsive to the level of an input signal;

counting means responsive to the output signal of the frequency generating means for producing a wave-train output whose pulse spacing is equal to the total spacing of N pulses of a signal appearing at the input of the counting means, where *N* is a predetermined integer;

phase comparison means for comparing the phases of the wave train output from the counting means and the reference signal and generating an error signal indicative of a phase difference therebetween, said error signal serving as the input signal to the frequency generating means to thereby vary the frequency of the output signal from the frequency generating means;

digital storage means for storing a representation of a rational fractional interval indicative of the fractional part of said desired rational multiple of said reference frequency;

digital accumulating means for periodically receiving the contents of the digital storage means and accumulating said contents and generating a carryover signal output whenever the accumulated contents exceed the storage capacity of the accumulating means; and cycle swallowing means interconnected between the frequency generating means and the counter means and being responsive to said carryover signal to alter by one cycle the output of the frequency generating means, for altering the phase of the signal directed to the counting means and phase comparison means by 360°.

2. An electronic frequency synthesizer as in claim 1 wherein the cycle swallowing means alters the phase of the signal directed to the counting means by minus 360° by removing one cycle from the output of the frequency generating means.

3. An electronic frequency synthesizer as in claim 1 wherein:

the digital storage means comprises means for storing a representation of the desired rational multiple of said reference frequency including both the integer N and the desired fractional interval; and the counting means is interconnected with the digital storage means for receiving therefrom the predetermined integer N.

4. An electronic frequency synthesizer as in claim 3 including loop filter means for suppressing undesired signal components in the phase-locked loop.

* * * * *

UNITED STATES PATENT AND TRADEMARK OFFICE

CERTIFICATE OF CORRECTION

PATENT NO. : 3,928,813

DATED : December 23, 1975

INVENTOR(S) : Charles A. Kingsford-Smith

It is certified that error appears in the above-identified patent and that said Letters Patent are hereby corrected as shown below:

Column 1, line 11, "snythesize" should read -- synthesize --; line 19, "($\underline{\div N}$)" should read -- (÷N) --; line 64, after "into" insert -- a --;

Column 3, line 63, "present" should read -- preset --;

Column 4, line 5, "substracts" should read -- subtracts --; line 45, "Q2" should read -- $\overline{Q}$2 --; line 57, "Q2" should read -- $\overline{Q}$2 --.

Signed and Sealed this

*sixth* Day of *April 1976*

[SEAL]

*Attest:*

RUTH C. MASON
*Attesting Officer*

C. MARSHALL DANN
*Commissioner of Patents and Trademarks*